United States Patent
Chilese et al.

(10) Patent No.: US 6,424,879 B1
(45) Date of Patent: Jul. 23, 2002

(54) SYSTEM AND METHOD TO CORRECT FOR DISTORTION CAUSED BY BULK HEATING IN A SUBSTRATE

(75) Inventors: Francis C. Chilese, San Ramon; Bassam Shamoun, Fremont; David Trost, San Francisco, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/291,167

(22) Filed: Apr. 13, 1999

(51) Int. Cl.[7] .............................................. G06F 19/00
(52) U.S. Cl. ..................................... 700/121; 250/491.1
(58) Field of Search ....................... 700/121; 250/491.1, 250/492.2

(56) References Cited

U.S. PATENT DOCUMENTS

| | | |
|---|---|---|
| 5,424,548 A | 6/1995 | Puisto |
| 5,742,065 A | 4/1998 | Gordon et al. |
| 5,757,015 A * | 5/1998 | Takemoto et al. ........ 250/491.1 |
| 5,834,785 A | 11/1998 | Coon ........................ 250/492.2 |
| 5,847,959 A | 12/1998 | Venklasen et al. ..... 364/468.28 |
| 5,969,365 A * | 10/1999 | Takemoto ................ 250/491.1 |

OTHER PUBLICATIONS

Stanton et al., Initial Wafer Heating Analysis For A Scalpel Lightography System, Microelectronic Engineering, May 1999, pp. 1999–2005, vol. 46, No. 1/04 Elsevier Publishers, BV., Amsterdam, NL.

Stanton et al., Initial Wafer Heating Analysis For A Scalpel Lithography System, Institute of Electrical Engineers, 98 MNE Int. Cong. 22–24.9.98, Inspec Database No. 6297099, XP002151118, 1999.

Zheng Cui, Mocasel: A Total Solution to Electra Beam Lithography Simulation Proc. SPIE–Int Soc. Opt. Eng., pp.494–505, vol. 3676, No. 1–2, Mar. 99.

* cited by examiner

*Primary Examiner*—Thomas Black
*Assistant Examiner*—Ronald Hartman, Jr.
(74) *Attorney, Agent, or Firm*—Kenneth C. Brooks

(57) ABSTRACT

An electron beam writing system includes an electron beam patterning machine operable to emit an electron beam to form a pattern on a substrate. A computer control system, coupled to the electron beam patterning machine, has a plurality of pre-computed distortion maps. Each distortion map describes expected distortions of the substrate caused by bulk heating resulting from exposure to the electron beam. The computer control system controls the electron beam patterning machine using the distortion maps in order to adjust for the expected distortions.

15 Claims, 8 Drawing Sheets

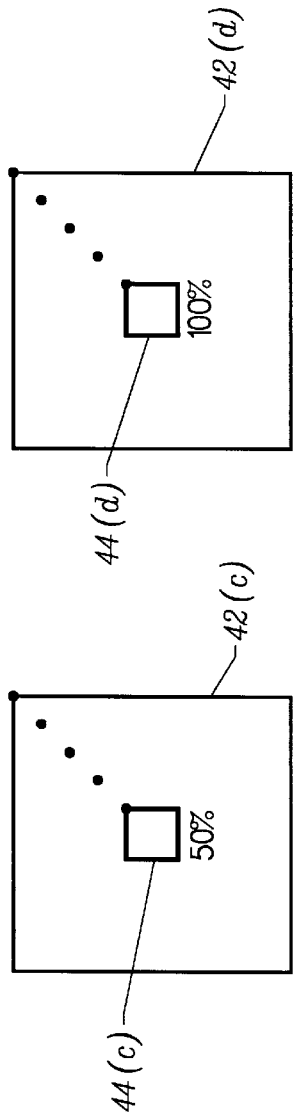
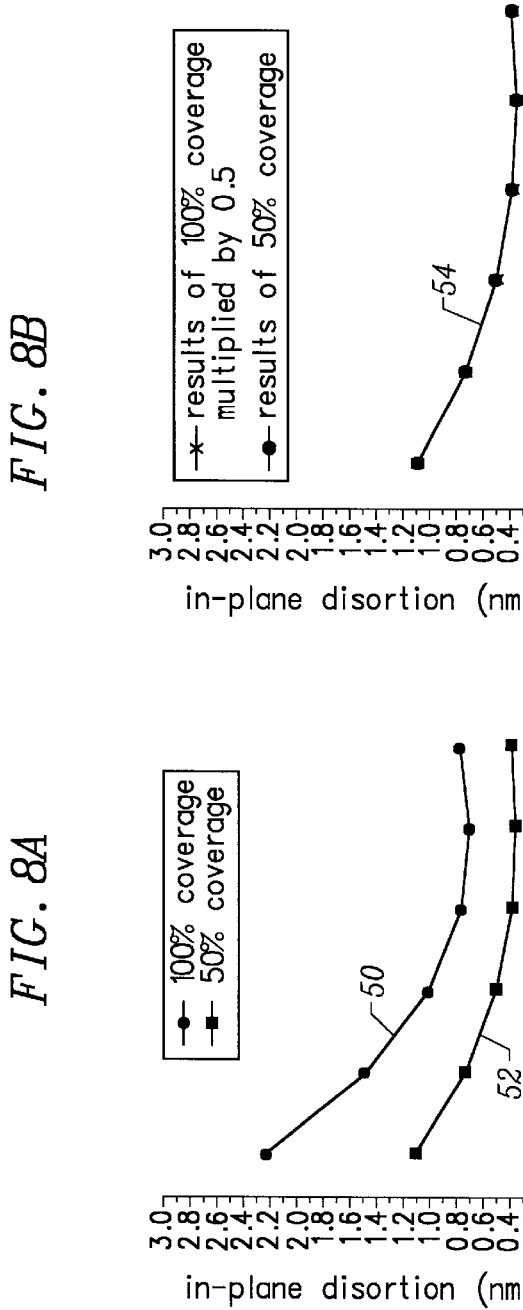
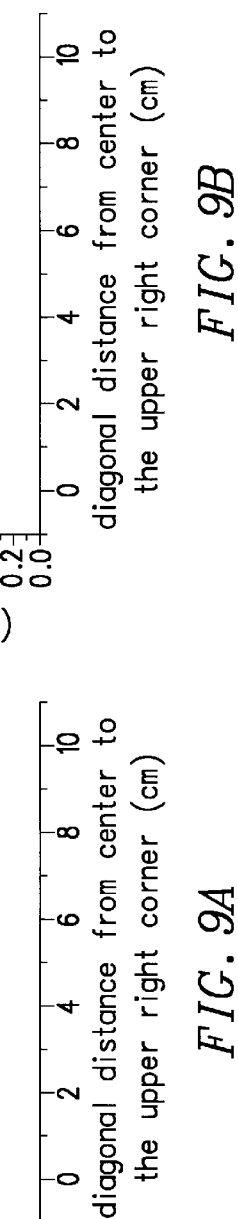

SYSTEM AND METHOD TO CORRECT FOR DISTORTION CAUSED BY BULK HEATING IN A SUBSTRATE

CROSS-REFERENCE TO RELATED PATENT

This application relates to the subject matter disclosed in U.S. Pat. No. 5,847,959 entitled "Method And Apparatus For Run-Time Correction of Proximity Effects And Pattern Generation," which is assigned to the present assignee and incorporated in its entirety herein by reference.

TECHNICAL FIELD OF THE INVENTION

The present invention relates generally to systems and methods used to form patterns on semiconductor substrates and, more particularly, to a system and method to correct for distortion caused by bulk heating in a substrate.

BACKGROUND OF THE INVENTION

In the manufacture of integrated circuits, an electron beam (or E-beam) lithography process may be used to form circuit patterns on a semiconductor substrate. In particular, a focused electron beam is accurately positioned and readily scanned on the substrate to expose radiation-sensitive material (e.g., electron beam resist), thereby "writing" a pattern or a mask into the material. This process of writing masks introduces heat into the substrate upon which the writing is done. Such heat can cause non-uniform thermal expansion of the substrate which, in turn, can cause errors in the placement of the pattern being written. That is, bulk (or global) heating of the photomask—caused by electron beam energy deposition during patterning—results in thermal expansion of the mask substrate, thereby producing errors in pattern placement.

SUMMARY OF THE INVENTION

The present invention provides a system and method which corrects for the thermal expansion of a substrate during the writing process of electron beam lithography, thereby preventing errors that would otherwise be caused by the thermal expansion. with this system and method, the amount of heat introduced into a substrate is calculated from pattern writing data which may specify, among other things, the patterns to be written onto the substrate, the power level of the electron beam, and the exposure times for the electron beam. The pattern writing data is used to manipulate one or more pre-computed or pre-calculated distortion maps from a finite element model, which simulate or model the thermal responses and/or distortions of a substrate at the time of writing. In one embodiment, a linear superposition technique may be employed with the finite element models to predict the distortions. Using the finite element models, as manipulated with the pattern writing data, an equal offset in the placement of a written feature can be introduced for each expected distortion during electron beam lithography so that when the substrate cools down (i.e., is no longer distorted), the written feature appears at the correct position on the substrate.

According an embodiment of the present invention, an electron beam writing system includes an electron beam patterning machine operable to emit an electron beam to form a pattern on a substrate. A computer control system, coupled to the electron beam patterning machine, has a plurality of pre-computed distortion maps. Each distortion map describes expected distortions of the substrate caused by bulk substrate heating resulting from exposure to the electron beam. The computer control system controls the electron beam patterning machine using the distortion maps in order to adjust for the expected distortions.

According to another embodiment of the present invention, a method includes the following: receiving pattern writing data from an electron beam patterning machine operable to emit an electron beam to form a pattern on a substrate; determining expected distortions of the substrate caused by bulk heating resulting from exposure to the electron beam using the pattern writing data and a plurality of pre-computed distortion maps; and controlling the electron beam patterning machine to adjust for the expected distortions.

According to yet another embodiment of the present invention, a storage medium includes a reference table for use with an electron beam patterning machine operable to emit an electron beam to form a pattern on a substrate. The reference table has a plurality of pre-computed distortion maps. Each distortion map describes expected distortions of the substrate resulting from exposure to the electron beam.

According to still yet another embodiment of the present invention, a computer control system is provided for controlling an electron beam patterning machine operable to emit an electron beam to form a pattern on a substrate. The computer control system includes a memory which stores a number of pre-computed distortion maps, each distortion map describing expected distortions of the substrate resulting from exposure to the electron beam. A processor, coupled to the memory, receives pattern writing data from the electron beam patterning machine. The processor generates control signals using the pattern writing data and the distortion maps. These control signals control the electron beam patterning machine to adjust for the expected distortions.

A technical advantage of the present invention includes using a finite element model to predict the bulk heating distortions of the photomask during electron beam patterning based on linear superposition theory. From these predictions, adjustments can be made to compensate for the distortions, thereby preventing the occurrence of errors due to inappropriate placement.

Another technical advantage of the present invention includes providing one or more pre-computed distortion maps which describe the thermal and/or mechanical responses of a substrate to electron beam patterning. The distortion maps are used, in conjunction with pattern writing data, to determine the distortions expected in a patterning process so that adjustments can be made for the same. Because the distortion maps are pre-computed, the computational time required to calculate the thermal distortions is significantly reduced.

Yet another technical advantage includes a linear superposition technique which may be employed to correct for distortion caused by bulk heating in a substrate. Such linear superposition technique is not limited to any particular mask writing strategy or pattern density distribution, and thus, has widespread applicability.

Other aspects and advantages of the present invention will become apparent from the following descriptions and accompanying drawings.

BRIEF DESCRIPTION OF THE DRAWINGS

For a more complete understanding of the present invention and for further features and advantages, reference is now made to the following description taken in conjunction with the accompanying drawings, in which:

FIGS. 8A and 8B illustrate the exemplary patterning of two cells in a pattern area, at different amounts of coverage;

FIGS. 9A and 9B are graphs illustrating the in-plane distortion of a substrate for the patterning depicted in FIGS. 8A and 8B;

DETAILED DESCRIPTION OF THE PREFERRED EMBODIMENTS

Embodiments of the present invention will be described with reference to methods and structures illustrated in FIGS. 1 through 12B of the drawings, wherein like numerals are used for like and corresponding parts of the various drawings. These illustrations are simplified representations provided for ease of understanding and description only. Various modifications, variations, or adaptations of the embodiments of the present invention may become apparent to those skilled in the art as they are described. All such modifications, variations, or adaptations that rely upon the teachings of the present invention, and through which these teachings have advanced the art, are considered to be within the spirit and scope of the present invention.

Electron Beam Writing Process

Figure 1:
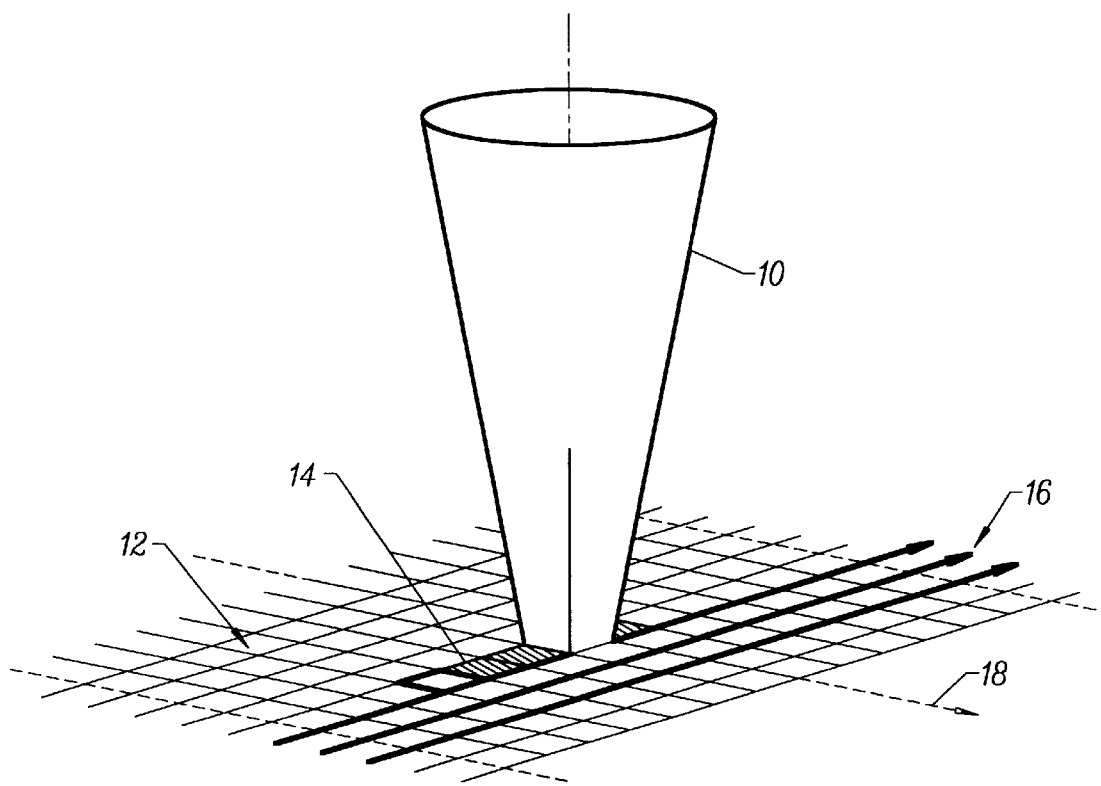
FIG. 1 is a simplified representation of an electron beam writing process wherein an electron beam is scanned over a substrate.

FIG. 1 is a simplified representation of an electron beam writing process wherein an electron beam 10 is scanned over a substrate 12. Substrate 12 may be mounted on a movable stage (not shown). The surface of substrate 12 is divided into a number of pixels 14 arranged as a grid. For clarity, only one pixel 14 has been labeled with a reference numeral in FIG. 1. Pixels 14 can each have a size in the range of approximately 0.05 to 0.2 µm in diameter. Electron beam 10, which can have a round or elliptical shape, may be scanned periodically in a first direction 16, while the stage on which substrate 12 is mounted moves in a second, orthogonal direction 18. Each scan of beam 10 exposes one or more rows of pixels 14, thus writing features having a size in the range of, for example, 0.2 to 2.0 µm.

To support this writing strategy, pattern writing data is used to direct the movement of electron beam 10 and/or the stage upon which substrate 12 is mounted, and to control the exposure (energy) level of beam 10. For example, the pattern writing data may specify one or more beam parameters which define the power of electron beam 10.

Distortion Caused By Global Thermal Expansion

Figure 2:
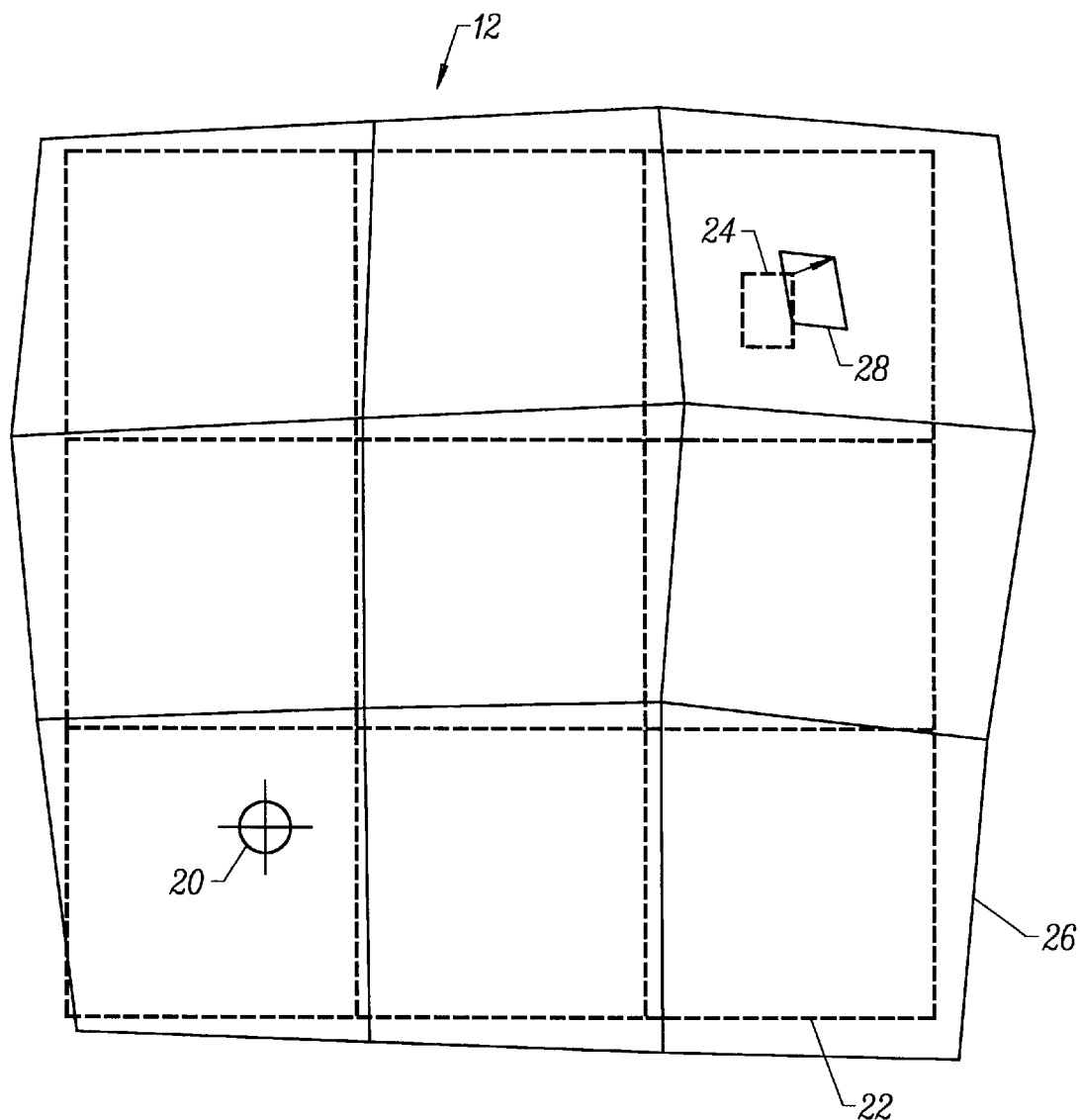
FIG. 2 illustrates the effects of global thermal expansion on a substrate during an electron beam writing process.

FIG. 2 illustrates the effects of global thermal expansion on a substrate 12 during electron beam processing. Substrate 12 may be mounted upon a three-point suspension (not shown) in such a way that it can expand elastically about a fixed point 20. The original shape for substrate 12 is a pattern grid 22 depicted in dotted lines. An exemplary origin 24 for a feature to be written on substrate 12 is also depicted in dotted lines.

As is well-known to those in the art, exposure of a given region on substrate 12 by an electron beam (not shown) produces heat which can be absorbed by that region. Such bulk heating changes the shape and location of the exposed region with respect to fixed point 20. That is, in general, the shape of substrate 12 expands or distorts, as represented by a pattern grid 26 depicted in solid lines. Thus, as the region is exposed, feature origin 24 shifts (with respect to fixed point 20) to a displaced position 28. This shift—referred to as a global thermal expansion effect—can cause a pattern feature to be written at the wrong place on a substrate 12.

Finite Element Thermal Model

The present invention provides a system and method to adjust or correct for the distortion caused by bulk heating of a substrate, thereby preventing placement errors in writing. To accomplish this, one or more finite element (FE) thermal models are created, for example, using empirical data or any of a number of existing finite element analysis programs for calculating thermal expansion behavior (e.g., ANSYS™ which is commercially available from Swanson Analysis Systems, Inc.). A finite element model simulates or models the distortion of a substrate attributable to bulk heating at discrete locations in the substrate. That is, with each finite element model, the volume of a hypothetical substrate is divided into a number of discrete units or "finite elements," and bulk-heating distortion is modeled for each finite element according to, for example, electron beam power level and time. A finite element model can thus be used to predict the bulk heating distortions induced in a substrate during electron beam patterning.

In one embodiment, a finite element model may be incorporated into, or used to derive, one or more distortion maps. Such distortion maps, which can be organized into a reference table, may be used in conjunction with pattern writing data (e.g., beam parameters) to control or adjust the positioning of an electron beam during writing in order to correct for distortion. In this way, pattern features are written at the correct locations on a substrate.

Various, exemplary finite element models, and respective distortion maps, are as follows.

One finite element model can be referred to as the real-time calculation model. To create this model, a time interval Δt (e.g., on the order of a minute) is chosen. As a pattern is written, the amount of energy deposited in each interval is calculated. During each time interval, a new finite element thermal model is computed. This process is reiterated with a new thermal load calculated for each new time interval. The output data (i.e., temperature distribution) from each time interval calculation is used as initial conditions for subsequent calculations. In particular, the results obtained from such thermal analysis are applied to a structural model of the substrate to determine displacement or distortion thereof.

Another finite element model—which can be referred to as the energy-distortion proportional model—generates the distortion map of a substrate for a given pattern density distribution using a pre-calculated distortion map of a substrate of known pattern density distribution. This is done by linearly scaling distortion vectors of the pre-calculated distortion map based on the cumulative electron beam energy to which the substrate is exposed. This energy-distortion proportional model requires advance knowledge of the mask writing style.

Yet another finite element model—which can be referred to as the linear superposition model—employs the concept of linear superposition to predict distortions in a substrate. With the linear superposition model, distortion data for the most general case of electron beam energy exposure is pre-calculated and stored into a reference table database. This reference table can then be accessed during real time writing to predict the bulk heating distortions in specific cases of electron beam energy exposure.

Electron Beam System With Correction For Distortion

Figure 3:
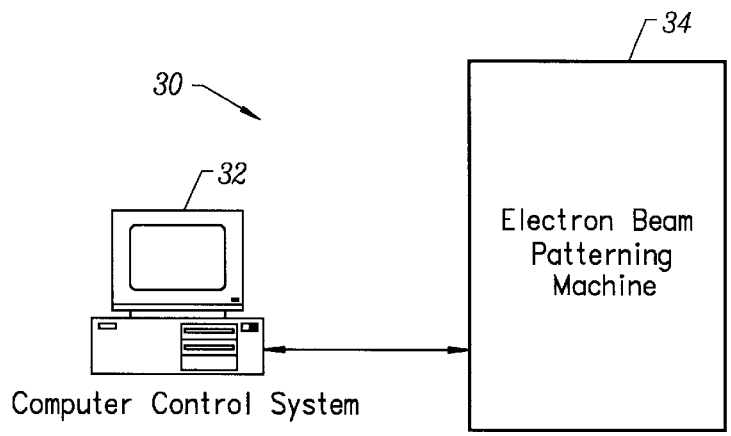
FIG. 3 illustrates an exemplary electron beam writing system, according to an embodiment of the present invention.

FIG. 3 illustrates an electron beam writing system 30, according to an embodiment of the present invention. In electron beam writing system 30, an electron beam is adjusted to correct for distortion caused by bulk heating in a photomask substrate. As shown, electron beam writing system 30 comprises a computer control system 32 coupled to an electron beam patterning (writing) machine 34. As used herein, the terms "coupled," "connected," or any variant thereof, means any coupling or connection, either direct or indirect, between two or more elements; the coupling or connection can be physical or logical. In another embodiment, computer control system 32 may be integral to, or incorporated into, electron beam patterning machine 34.

Electron beam patterning machine 34 generally functions to produce and scan (emit) an electron beam upon a substrate 12 (see FIGS. 1 and 2) to expose electron beam-sensitive material (e.g., electron beam resist), thereby writing a pattern onto the substrate. Electron beam patterning machine 34 can be implemented with any of a number of suitable devices, such as, for example, a MEBES™ machine. The writing of patterns on a substrate can be in accordance with patterns, exposure times, and power levels specified in pattern writing data.

Computer control system 32 is in communication with the operating system of electron beam patterning machine 34. Computer control system 32 functions to direct or control the writing of patterns onto a substrate by electron beam patterning machine 34. Computer control system 32 may incorporate and employ one or more of the various finite element models (described herein) which simulate the bulk heating of the substrate. Each of these finite element models may include thermal and structural sub-models which are developed to determine the thermal and mechanical responses of a mask substrate during electron beam patterning. Computer control system 32 uses the finite element models to identify mask-related distortions during electron beam patterning and to calculate the resulting potential errors in placement. Computer control system 32 can then control or direct the beam of electron beam patterning machine 34 in order to compensate for the potential placement errors. Computer control system 32 can be implemented with any suitable computer, such as, for example, a PC-compatible computer having a processor with supporting memory, running any suitable operating system.

Computer Control System

Figure 4:
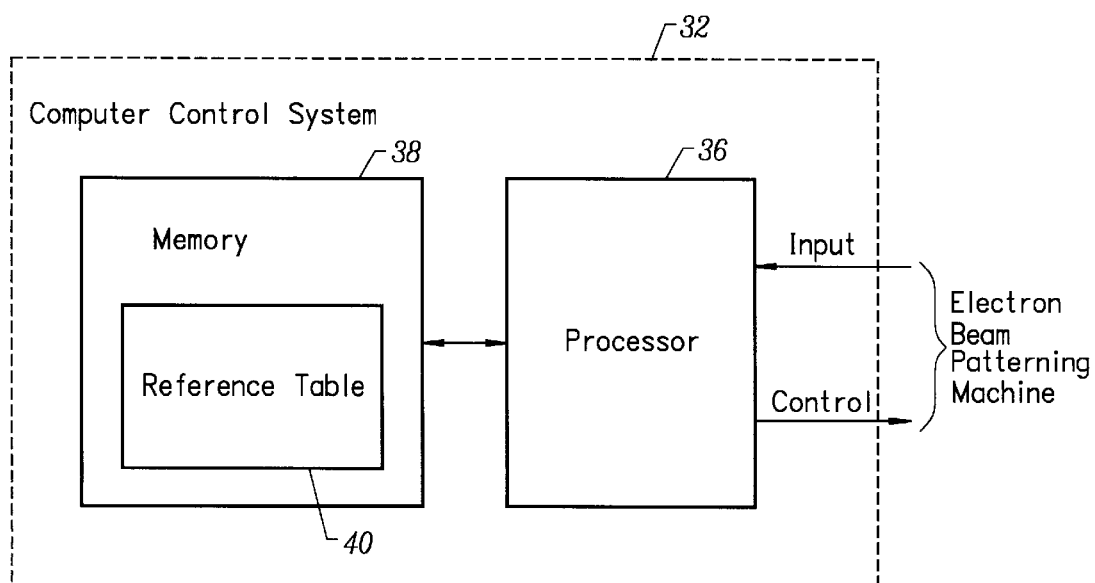
FIG. 4 is a block diagram of a computer control system, according to an embodiment of the present invention.

FIG. 4 is a block diagram of computer control system 32, according to an embodiment of the present invention. Computer control system 32 directs or controls the scanning of an electron beam output by electron beam patterning machine 34 (FIG. 3) to which computer control system 32 is coupled or incorporated. As shown, computer control system 32 comprises a processor 36 and a memory 38.

Processor 36 may receive input from electron beam patterning machine 34. This input may include pattern writing data which can specify, among other things, the patterns to be written onto a substrate, one or more power/energy levels for the electron beam during the writing process, and respective exposure times for the electron beam at each power/energy level. Processor 36 processes the input information in various ways. This processing may include determining or identifying mask-related distortions attributable to bulk heating during electron beam patterning, and calculating adjustments for the scan of the electron beam to compensate for the same. For each distortion, the adjustments can be in the form of an equal and opposite offset in the placement of a written feature so that when the substrate cools down (i.e., is no longer distorted), the written feature appears at the correct position on the substrate. Processor 36 outputs or generates control signals which convey, among other things, the calculated adjustments to electron beam patterning machine 34. The functionality of processor 36 can be performed by any suitable processor, such as a mainframe, file server, workstation, or other suitable data processing facility running appropriate software.

Memory 38 is connected to processor 36 and primarily functions to receive, store, and forward various information which may be utilized within computer control system 32. Memory 38 can reside in any suitable storage medium, such as random access memory (RAM), read-only memory (ROM), disk, tape storage, or other suitable volatile and/or non-volatile data storage system. In one embodiment, memory 38 comprises a relational database.

As shown, memory 38 may maintain a reference table 40. Reference table 40 includes information specifying, or derived from, one or more thermal models simulating the bulk heating of a substrate based on finite element (FE) analysis. In one embodiment, reference table 40 comprises one or more distortion maps. Each such distortion map can be used by processor 36 in order to determine or calculate bulk-heating distortions in a substrate so that processor 36 can generate control signals to compensate for the same.

Construction of Reference Table

Figure 5A:
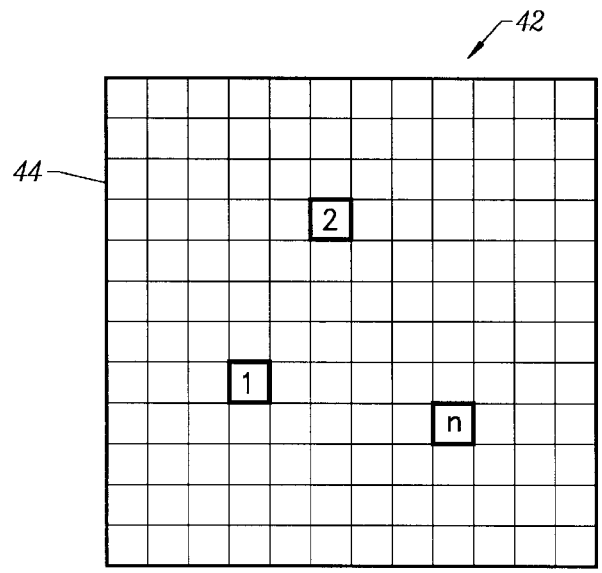
FIGS. 5A and 5B illustrate the construction of an exemplary reference table, according to an embodiment of the present invention.
Figure 5B:
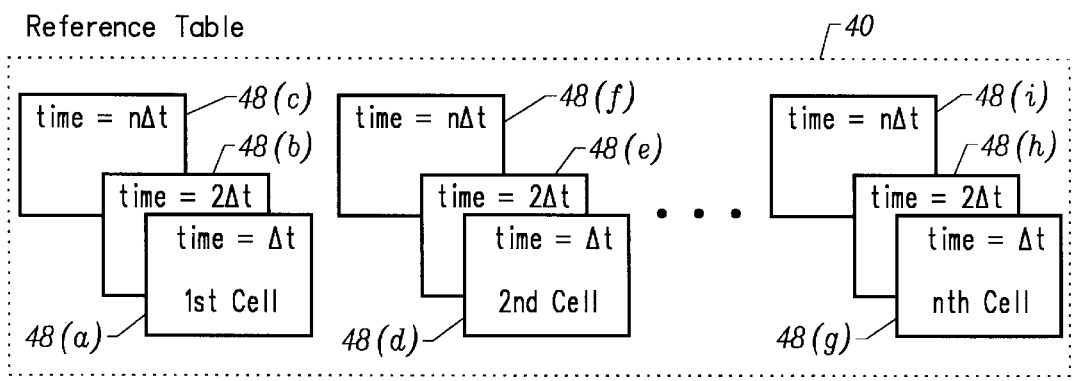

FIGS. 5A and 5B illustrate the construction of an exemplary reference table 40, according to an embodiment of the present invention. In general, reference table 40 contains information which may be used to correct or adjust for distortion in a substrate attributable to bulk heating. As described herein, reference table 40 can be saved in memory 38 of a computer control system 32 in communication with the operating system of an electron beam patterning machine 34.

FIG. 5A illustrates the division of a pattern area 42 of a substrate into n cells 44. For clarity, only one cell 44 is labeled with a reference numeral. The size or area of each cell 44 can be selected based upon the accuracy required to correct for pattern placement errors and the computer memory available to store and dynamically access reference table 40. In one embodiment, each cell 44 occupies a surface area of approximately one square centimeter.

In a finite element model simulation analysis, each cell 44 constitutes one or more "finite elements." Using these finite elements, one or more thermal and/or structural finite element models are computed or generated in advance of the actual writing on a substrate. Generally, to accomplish this, for each individual cell 44, a unit of energy is introduced into that cell 44 and accurate distortion maps of the entire mask are then computed at regular time intervals (e.g., one minute).

More specifically, in a thermal model simulation analysis, thermal load is applied to each cell 44 in the pattern area 42 for a period of time, Δt. The thermal load for each cell 44 generally corresponds to the amount of electron beam exposure that a cell receives. This exposure takes into account the power/energy level of the electron beam scanned on a cell 44 and also the period during which the cell is subjected to the beam. The power/energy level of the electron beam can be determined from beam parameters specified in pattern writing data. The time Δt corresponds to the real time required to expose an equivalent area in the substrate during actual writing.

In one embodiment, the thermal model simulation analysis considers both conductive and radiative heat transfer mechanisms, which are deemed to occur in a vacuum. Equivalent surface heat flux is used to simulate the thermal energy deposition in the substrate, and radiative thermal boundary conditions are used.

In an exemplary structural model simulation analysis, the substrate is considered to be supported by a "2-2-2" kinematic mount located at a radial distance of 59.4 mm from the center of the substrate. Such mounting conditions are typical of a MEBES™ electron beam machine.

Bulk heating of a substrate is a dynamic process wherein the distortion of any cell 44 at a given moment of time during writing depends upon not only the energy to which that cell was exposed but also the energy to which neighboring cells were exposed. Thus, to predict the distortion of a substrate at a particular location and at particular time during writing requires knowledge of the patterning to which the entire substrate was previously subjected. To accomplish this, one or more distortion maps are pre-calculated for discrete time periods Δt.

FIG. 5B illustrates reference table 40 comprising a plurality of distortion maps 48 which can be generated in the finite element model simulation analysis for substrate pattern area 42 of FIG. 5A. Distortion maps 48 are separately labeled with reference numerals 48(a)–48(i).

Distortion maps 48 may be grouped in sets, wherein all the maps 48 of a set correspond to a particular cell 44 in substrate pattern area 42. As shown, for example, a set comprising distortion maps 48(a)–48(c) corresponds to the first cell 44 of substrate pattern area 42; a set comprising distortion maps 48(d)–48(f) corresponds to the second cell 44; and a set comprising distortion maps 48(g)–48(i) corresponds to the nth cell 44 of substrate pattern area 42. Within each set, each distortion map 48 is associated with a different time period or frame (e.g., t=Δt, t=2Δt, t=3Δt, or t=4Δt).

Each distortion map 48 in the reference table 40 describes the thermo-mechanical responses of a substrate, at the respective time frame, as a result of patterning the respective cell 44 in pattern area 42. In one embodiment, for example, each distortion map 48 may specify vectors corresponding to the amount of distortion expected at a respective cell 44 resulting from exposure to an electron beam at a specified power level and at a particular moment. Exemplary vectors may thus specify that 0.5 nm and 0.3 nm of distortion are expected in a first (x) and second (y) dimensions, respectively, for the tenth cell 44 in a pattern area at a third time frame. Each distortion map 48 may assume that all of the respective cell 44 is exposed to the electron beam (i.e., 100% pattern coverage on the substrate for the relevant area).

The data in distortion maps 48 of reference table 40 can be used to predict the distortion attributable to bulk heating during an actual writing process performed on the substrate, as described below.

In one embodiment, a single, finite element distortion model of the substrate is generated based on writing in a predetermined order and with a fixed pattern density. When any given point on the substrate is then written, the computer control system 32 calculates the ratio between the total energy introduced into the substrate up until that time and the corresponding value in the model. The computed distortion in the model is then multiplied by this ratio to generate the correction. In another embodiment, a linear superposition technique is used to accurately compute the distortion of the substrate. In addition to being accurate, this linear superposition technique allows the substrate to be written or patterned in any order.

Operation of Electron Beam Writing System

In an exemplary operation for electron beam writing system 30 (FIG. 3), a plurality of distortion maps 48 are stored into the memory of computer control system 32 coupled to electron beam patterning machine 34. When the substrate is written, the computer control system 32 keeps track of how much energy is put into each of the cells 44 (FIG. 5A) in any given time increment. This is accomplished by communicating pattern writing data from electron beam patterning machine 34 to computer control system 32. The pattern writing data may specify, among other things, a sequence of patterning steps, the patterns to be written onto various locations of substrate pattern area 42 at each step, the power level of the electron beam for each step, and the exposure times.

Based on the location and units of energy deposited in the pattern area 42 at the given time increment, computer control system 32 calculates the expected distortion attributable to bulk heating. In one embodiment, computer control system 32 accomplishes this by extracting and linearly scaling the distortion vectors for the entire substrate from the appropriate distortion maps 48.

Computer control system 32 then generates control signals which introduce an equal and opposite offset in pattern placement for each calculated distortion. The control signals direct the scanning of the electron beam produced by electron beam patterning machine 34. In particular, the scan of the electron beam is adjusted according to each offset, thereby offsetting or compensating for the respective distortion so that the desired pattern feature appears at the appropriate position on the substrate when the substrate cools down.

A method in accordance with an embodiment of the present invention corresponds to the operation of electron beam writing system 30 herein described.

Linear Superposition

The linear superposition technique, in accordance with an embodiment of the present invention, can be applied to predict the thermal and mechanical responses of a substrate during electron beam patterning under certain circumstances—i.e., if the maximum temperature rise for the substrate is only a few degrees.

In particular, the general form of a heat diffusion equation which describes the thermal responses of a substrate during electron beam patterning is as follows:

$$k\nabla^2 T - \epsilon\sigma A(T^4 - T^4_{sur}) + q'''V = \rho c \, V \partial T/\partial t \tag{1}$$

where $T$ and $T_{sur}$ are the temperatures of the substrate and the surrounding, respectively; $k$, $\epsilon$, $p$, $c$ are the thermal conductivity, the emissivity, the density, and the heat capacity of the substrate material, respectively; $A$ and $V$ are the surface area and volume of the substrate, respectively; and $\sigma$ is the Stefan-Boltzmann constant.

For given electron beam parameters and under the most stringent conditions of bulk heating during photomask patterning, the maximum temperature rise of the substrate is only one or two degrees. This means that the radiation term in the above equation can be approximated and written as follows:

$$4\epsilon\sigma AT^3_{sur} (T-T_{sur}) \qquad (2)$$

With this approximation, equation (1) becomes linear, thus allowing the use of a linear superposition technique to predict the thermal responses of the substrate during writing.

In one embodiment, the linear superposition technique may be implemented in the following manner:

(1) The substrate is divided into an array of cells (as previously described), each cell of order one centimeter square. For each cell, a finite element computation is performed which predicts the distortion, as a function of time, that results from the introduction of one unit of energy into that cell at the beginning of a corresponding time step. In this way, a reference table of distortion maps is created for each cell over multiple time steps.

(2) As the mask is written over a series of time steps, electron beam writing system 30 keeps track of how much energy is introduced into each cell in a given time step. The distortion produced by the energy input during that time step may then be formed from a linear summation. This summation takes the ratio of the energy introduced in each cell to the unit of energy used in the reference table. The corresponding distortion map is multiplied by that ratio. This is performed for all the cells written in this time step. A distortion map is created which sums (vectorially) each cell of the ratioed maps.

(3) In the next time step, the process described immediately above is repeated, thereby yielding a map of the distortion produced by this next time step only. To this distortion is added a recomputation of the distortion computed for the previous time step, but this time computed from the ratios of distortion maps advanced one time step ahead.

(4) The processes described above are repeated for each time step in the series until distortion is computed for the last time step in the series.

Figure 6:
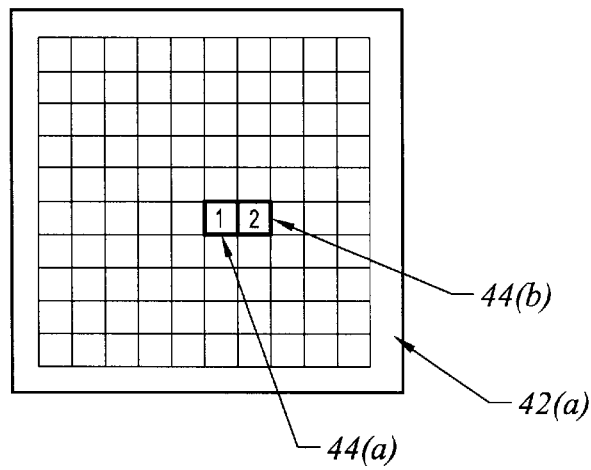
FIG. 6 illustrates the exemplary patterning of two adjacent cells.

To demonstrate that linear superposition accurately estimates bulk heating, the following test case—described with reference to FIGS. 6, 7A, and 7B—was considered. FIG. 6 illustrates the exemplary patterning of two cells 44(a) and 44(b) by electron beam exposure in a pattern area 42(a). Cells 44(a) and 44(b) were specifically chosen as adjacent cells in order to represent the worst case expected when using the linear superposition technique. That is, with cells 44(a) and 44(b) adjacent to each other, a maximum temperature rise is expected. Consequently, the nonlinearity in equation (1) due to the radiation term becomes most pronounced, thereby producing maximum error.

It is assumed that the time required to pattern each cell 44(a) and 44(b) is Δt and that the cells are patterned sequentially. Thus, cell 44(a) may be considered to be patterned at time t=Δt, and cell 44(b) may be considered to be patterned at time t=2Δt. Using the linear superposition technique, the distortion of the entire substrate at the end of patterning both cells 44(a) and 44(b) (i.e., at t=2Δt) can be obtained by vectorially adding the distortion due to patterning cell 44(a) to the distortion due to patterning cell 44 (b).

Figure 7A:
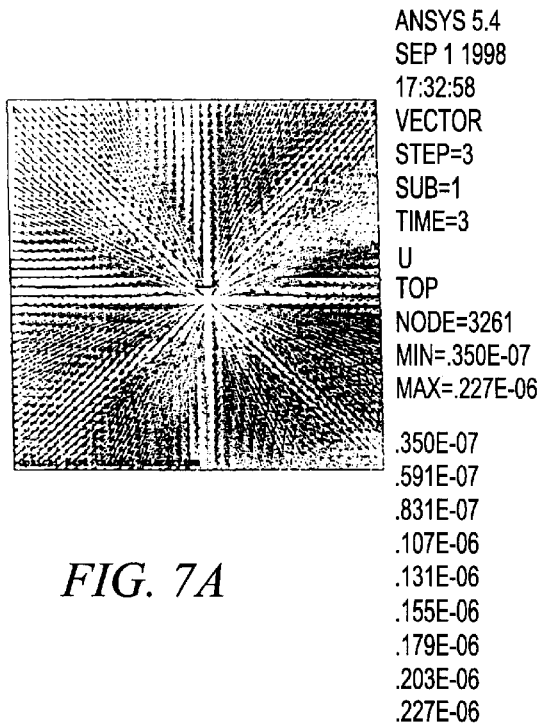
FIGS. 7A and 7B are graphs illustrating the in-plane distortion of a substrate for the patterning depicted in FIG. 6.
Figure 7B:
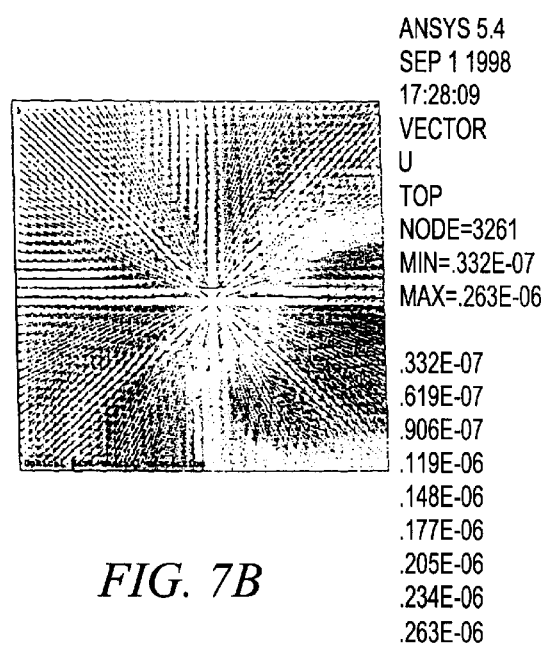

FIGS. 7A and 7B are graphs illustrating the in-plane distortion, for the case shown and described with reference to FIG. 6, as obtained using the forward technique (i.e., straightfoward finite element calculation) and the linear superposition technique, respectively. A comparison of FIG. 7A with FIG. 7B yields a maximum difference (error) of approximately ten percent between the distortion obtained by the forward technique and that obtained by the linear superposition technique. The error generated in the proposed linear superposition technique can be further minimized by optimizing the size of the simulated cells 44 in the finite element models. Thus, the linear superposition technique produces a relatively accurate computation of the distortion attributable to bulk heating in a substrate.

Additional test cases were considered to further validate the linear superposition technique. These test cases, which are relevant to other embodiments of the present invention, examined the effects of different variables on the accuracy of the distortion predicted using the linear superposition technique. The variables which were considered included the pattern density (or coverage) of the substrate, and the shape of cells in the finite element models. Exemplary test cases are described below.

Pattern Density (Coverage)

One test case demonstrated that the distortion attributable to bulk heating is linearly proportional to the pattern density or coverage of a substrate. Thus, according to an embodiment of the present invention, distortion data obtained from a reference case in which all of a substrate is patterned (i.e., one-hundred percent coverage) can be linearly scaled to predict the distortion of a substrate for any given pattern density. This test case is described with reference to FIGS. 8A, 8B, 9A, and 9B.

FIGS. 8A and 8B illustrate the exemplary patterning of two cells 44(c) and 44(d) by electron beam exposure, at different amounts of coverage, in respective substrate pattern areas 42(c) and 42(d). It should be noted that, in general, the amount of coverage for a cell 44 can be derived from pattern writing data.

Cell 44(c) was subjected (exposed) to a pattern density of fifty percent, whereas cell 44(d) was subjected to a pattern density of one-hundred percent. A number of distortions were obtained (calculated) for selected points on substrate pattern areas 42(c) and 42(d) taken along respective diagonals extending from the center to the upper right corner.

FIG. 9A is a graph illustrating the distortions attained from finite element simulations of patterning using the different percent coverages of FIGS. 8A and 8B. A line 50 corresponds to the distortions at the various selected points along the diagonal of pattern area 42(d), which contains cell 44(d) having one-hundred percent coverage; a line 52 corresponds to the distortions at the various selected points along the diagonal of pattern area 42(c), which contains cell 44(c) having fifty percent coverage. FIG. 9B is a graph illustrating the results of multiplying the distortions corresponding to one-hundred percent coverage in FIG. 9A by one-half. A line 54 in FIG. 9B represents these results.

A comparison of FIGS. 9A and 9B—especially line 52 (corresponding to fifty percent coverage) and line 54 (corresponding to one-hundred percent coverage multiplied by one-half)—verifies the linear relationship between distortion and pattern density.

Geometry of a Cell

Another test case demonstrated that finite element model simulations based upon one kind of geometry or shape (e.g., square) for a cell 44 are still useful in determining the distortion that occurs in an actual patterning process which operates on cells of a different shape (e.g., rectangular). Thus, according to an embodiment of the present invention, distortion data derived from a finite element model based upon one kind of shape for cells 44 can be used in the linear superposition technique to determine distortions in an actual patterning process operating on cells of another shape. This test case is described with reference to FIGS. 10A, 10B, 11A, 11B, 12A, and 12B.

Figure 10A:
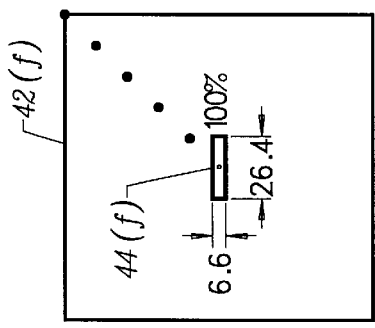
FIGS. 10A and 10B illustrate the exemplary patterning of two cells having the same surface area but different shapes.
Figure 10B:
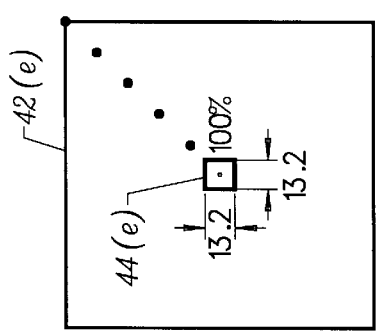

FIGS. 10A and 10B illustrate the exemplary patterning by electron beam exposure of two cells 44(*e*) and 44(*f*), having different shapes, in respective substrate pattern areas 42(*e*) and 42(*f*). As depicted, cell 44(*e*) has a square shape with dimensions 13.2×13.2, and cell 44(*f*) has a rectangular shape with dimensions 26.4×6.6. Thus, cells 44(*e*) and 44(*f*) have the same surface area. It was assumed for both cells 44(*e*) and 44(*f*) that the patterning coverage is one-hundred percent and the patterning time is the same.

A number of thermal responses and mechanical responses (e.g., distortions) were obtained/calculated for selected points on substrate pattern areas 42(*e*) and 42(*f*) taken along respective diagonals extending from the center to the upper right corner. The responses were calculated for two time frames: $t=\Delta t$, and $t=2\Delta t$.

Figure 11A:
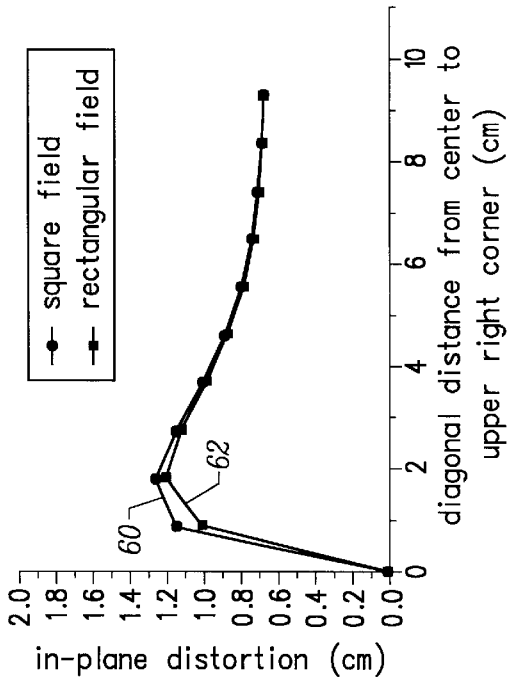
FIGS. 11A and 11B are graphs illustrating the thermal responses and in-plane distortion, respectively, of a substrate for the patterning depicted in FIGS. 10A and 10B at a first time frame.
Figure 11B:
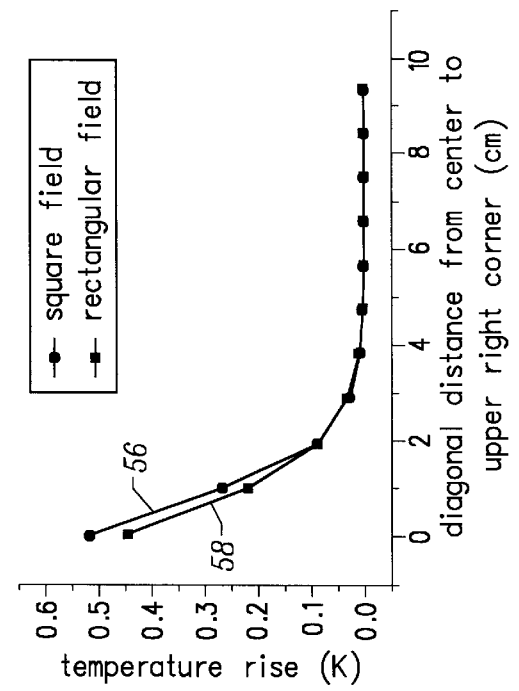

FIGS. 11A and 11B are graphs illustrating the thermal responses and distortions, respectively, obtained for the substrates depicted in FIGS. 10A and 10B at time frame $t=\Delta t$. Specifically, in FIG. 11A, a line 56 corresponds to the thermal responses at the various selected points along the diagonal of pattern area 42(*e*) having square-shaped cell 44(*e*); and a line 58 corresponds to the thermal responses at the various selected points along the diagonal of pattern area 42(*f*) having rectangular-shaped cell 44(*f*). In FIG. 11B, a line 60 corresponds to the distortions at the various selected points along the diagonal of pattern area 42(*e*) having square-shaped cell 44(*e*); and a line 62 corresponds to the distortions at the various selected points along the diagonal of pattern area 42(*f*) having rectangular-shaped cell 44(*f*). A comparison of lines 60 and 62 yields a maximum difference of approximately ten percent in the resulting distortion between the square and rectangular shaped cells at time frame $t=\Delta t$.

The amount of difference in distortion, however, is attenuated over time as each respective substrate moves toward a quasi-equilibrium state. This is clearly shown in FIGS. 12A and 12B, which plot the thermal responses and distortions of the same selected points at time frame $t=2\Delta t$.

Figure 12B:
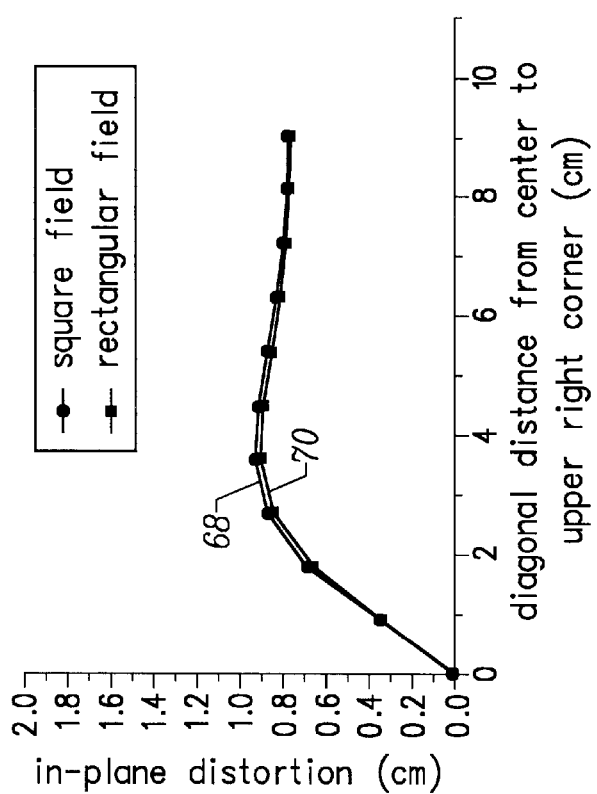
FIGS. 12A and 12B are graphs illustrating the thermal responses and in-plane distortion, respectively, of a substrate for the patterning depicted in FIGS. 10A and 10B at a second time frame.
Figure 12A:
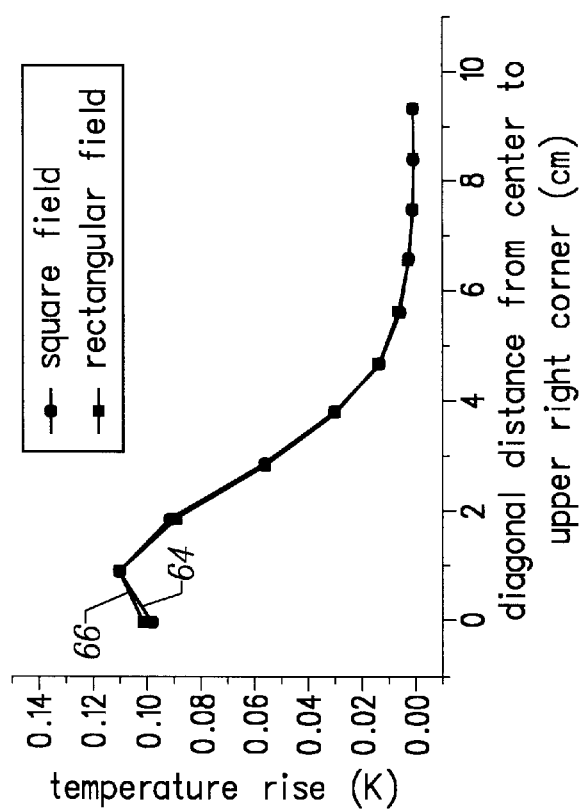

That is, FIGS. 12A and 12B are graphs illustrating the thermal responses and distortions, respectively, obtained for the substrates depicted in Figures 10A and 10B at time frame $t=2\Delta t$. In FIG. 12A, a line 64 corresponds to the thermal responses at the various selected points along the diagonal of pattern area 42(*e*) having square-shaped cell 44(*e*); and a line 66 corresponds to the thermal responses at the various selected points along the diagonal of pattern area 42(*f*) having rectangular-shaped cell 44(*f*). In FIG. 12B, a line 68 corresponds to the distortions at the various selected points along the diagonal of pattern area 42(*e*) having square-shaped cell 44(*e*); and a line 70 corresponds to the distortions at the various selected points along the diagonal of pattern area 42(*f*) having rectangular-shaped cell 44(*f*). A comparison of lines 68 and 70 yields a maximum difference of less than three percent in the resulting distortion between the square and rectangular shaped cells at time frame $t=2\Delta t$.

The above-described results suggest that, although the cells in an actual writing process may have a different shape from the cells of the finite element model simulations, such simulations can still be used predict the distortions attributable to bulk heating which occur during the actual writing, provided that sufficient time (e.g., a few time frames following exposure) has lapsed.

Accordingly, the present invention provides a system and method which corrects for thermal expansion in a substrate during an electron beam writing process, thereby preventing errors that would otherwise be caused by bulk heating. In one embodiment, a linear superposition technique may be employed to predict the distortions caused by electron beam bulk heating during patterning. This technique, which has been evaluated using finite element analysis in a number of test cases, can be used to correct for most of the distortion expected in the substrate attributable to bulk heating during electron beam writing.

While particular embodiments of the present invention and their advantages have been shown and described. It should be understood that various changes, substitutions, and alterations can be made therein without departing from the spirit and scope of the invention as defined by the appended claims.

What is claimed is:

1. An electron beam writing system comprising:
   an electron beam patterning machine operable to emit an electron beam to form a pattern on a substrate; and
   a computer control system coupled to the electron beam patterning machine and having a plurality of pre-computed distortion maps, each distortion map including a plurality of vectors corresponding to at least a portion of expected distortions of the substrate caused by bulk heating resulting from exposure to the electron beam, the computer control system operable to control the electron beam patterning machine using the distortion maps in order to adjust for the expected distortions by employing a linear superposition technique to linearly scale the vectors according to the pattern to be formed on the substrate.

2. The electron beam writing system of claim 1 wherein the substrate has a surface which can logically be divided into a plurality of cells, and at least one distortion map is provided for each cell.

3. The electron beam writing system of claim 1 wherein a separate distortion map is provided for each of a number of time frames.

4. The electron beam writing system of claim 1 wherein the computer control system is operable to derive an offset for each expected distortion.

5. The electron beam writing system of claim 1 wherein the electron beam patterning machine is operable to output pattern writing data to the computer control system.

6. The electron beam writing system of claim 5 wherein the computer control system manipulates the distortion maps using the pattern writing data.

7. The electron beam writing system of claim 1 wherein the distortion maps are organized into a reference table.

8. A method comprising:
   receiving pattern writing data from an electron beam patterning machine operable to emit an electron beam to form a pattern on a substrate;
   determining expected distortions of the substrate caused by bulk heating resulting from exposure to the electron beam using the pattern writing data and a plurality of pre-computed distortion maps, employing a linear superposition technique to predict the distortions; and
   controlling the electron beam patterning machine to adjust for the expected distortions.

9. The method of claim 8 wherein determining comprises:
   extracting from the distortion maps a vector corresponding to at least a portion of the expected distortions; and
   linearly scaling the extracted vector according to the pattern to be formed on the substrate.

10. The method of claim 8 wherein controlling comprises deriving an offset for each expected distortion.

11. The method of claim 10 wherein controlling comprises adjusting a scan of the electron beam according to each offset.

12. The method of claim 8 wherein the substrate has a surface which can logically be divided into a plurality of cells, and at least one distortion map is provided for each cell.

13. A computer control system for controlling an electron beam patterning machine operable to emit an electron beam to form a pattern on a substrate, the computer control system comprising:

a memory storing a plurality of pre-computed distortion maps, each distortion map describing expected distortions of the substrate resulting from exposure to the electron beam, with each distortion map comprising a plurality of vectors corresponding to at least a portion of the expected distortions; and a processor coupled to the memory, the processor operable to receive pattern writing data from the electron beam patterning machine, the processor operable to generate control signals using the pattern writing data and the distortion maps, the control signals for controlling the electron beam patterning machine to adjust for the expected distortions by employing a linear superposition technique to linearly scale the vectors according to the pattern to be formed on the substrate.

14. The computer control system of claim 13 wherein the substrate has a surface which can logically be divided into a plurality of cells, and at least one distortion map is provided for each cell.

15. The computer control system of claim 13 wherein a separate distortion map is provided for each of a number of time frames.

* * * * *